(12) United States Patent
Liu et al.

(10) Patent No.: US 10,976,116 B2
(45) Date of Patent: Apr. 13, 2021

(54) LIQUID COOLED HEAT DISSIPATION DEVICE

(71) Applicant: Coretronic Corporation, Hsin-Chu (TW)

(72) Inventors: Wei-Chi Liu, Hsin-Chu (TW);
Tsung-Ching Lin, Hsin-Chu (TW);
Shi-Wen Lin, Hsin-Chu (TW);
Chi-Chuan Wang, Hsin-Chu (TW);
Yong-Dong Zhang, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 30 days.

(21) Appl. No.: 16/367,162

(22) Filed: Mar. 27, 2019

(65) Prior Publication Data
US 2019/0360764 A1 Nov. 28, 2019

(30) Foreign Application Priority Data
May 28, 2018 (CN) .......................... 201810520554.2

(51) Int. Cl.
*F28F 3/02* (2006.01)
*F28F 9/00* (2006.01)
*H05K 7/20* (2006.01)

(52) U.S. Cl.
CPC ................ *F28F 3/02* (2013.01); *F28F 9/001* (2013.01); *H05K 7/20272* (2013.01);
(Continued)

(58) Field of Classification Search
CPC ..... F28D 2021/0028; F28D 2021/0029; F21V 29/56; H01L 23/473
See application file for complete search history.

(56) References Cited

U.S. PATENT DOCUMENTS 1,524,520 A * 1/1925 Junkers ..................... F28F 1/24
165/146
4,765,397 A * 8/1988 Chrysler ............... H01L 23/473
165/104.33
(Continued)

FOREIGN PATENT DOCUMENTS

CN 1859837 11/2006
CN 102342191 2/2012
(Continued)

OTHER PUBLICATIONS

"Office Action of China Counterpart Application", dated Dec. 2, 2020, p. 1-p. 7.

*Primary Examiner* — Jianying C Atkisson
*Assistant Examiner* — Jose O Class-Quinones
(74) *Attorney, Agent, or Firm* — JCIPRNET

(57) ABSTRACT

A liquid cooled heat dissipation device including a housing, at least two cooling fin modules, an input pipe, and an output pipe is provided. The housing has an accommodation space. The at least two cooling fin modules are disposed in the accommodation space. The input pipe is disposed on the top plate, the front plate, the rear plate, or one of the side plates of the housing and communicates with the accommodation space. The output pipe is disposed on the top plate, the front plate, the rear plate, or the other one of the side plates of the housing and communicates with the accommodation space. The at least two cooling fin modules have different arrangement densities and different fin thicknesses.

9 Claims, 3 Drawing Sheets

(52) U.S. Cl.
CPC ..... *H05K 7/20409* (2013.01); *H05K 7/20981* (2013.01); *F28F 2215/04* (2013.01)

(56) References Cited

U.S. PATENT DOCUMENTS

| | | | | |
|---|---|---|---|---|
| 4,884,630 | A * | 12/1989 | Nelson | H01L 23/473 165/170 |
| 5,005,640 | A * | 4/1991 | Lapinski | F28D 9/00 165/142 |
| 5,437,328 | A * | 8/1995 | Simons | F28F 3/086 165/146 |
| 5,859,763 | A * | 1/1999 | Nam | F28D 15/0266 361/699 |
| 6,152,215 | A * | 11/2000 | Niggemann | F28D 9/04 165/104.33 |
| 7,035,104 | B2 * | 4/2006 | Meyer | F28F 3/12 165/104.33 |
| 7,757,752 | B2 | 7/2010 | Egawa et al. | |
| 7,987,899 | B2 * | 8/2011 | Kurtz | F28F 3/048 165/168 |
| 8,387,685 | B2 * | 3/2013 | Kimbara | H01L 23/473 165/169 |
| 8,899,307 | B2 * | 12/2014 | Nishi | H01L 23/473 165/104.33 |
| 9,439,325 | B2 | 9/2016 | Campbell et al. | |
| 2004/0066625 | A1 * | 4/2004 | Meyer | F28F 3/12 361/699 |
| 2005/0225938 | A1 * | 10/2005 | Montgomery | H01L 23/4336 361/695 |
| 2006/0219387 | A1 * | 10/2006 | Atarashi | H01L 23/473 165/80.4 |
| 2007/0158050 | A1 * | 7/2007 | Norley | H01L 24/29 165/80.4 |
| 2007/0240867 | A1 * | 10/2007 | Amano | H01L 23/473 165/168 |
| 2008/0029260 | A1 * | 2/2008 | Hu | F28F 3/12 165/182 |
| 2008/0239671 | A1 * | 10/2008 | Amano | H01L 23/3735 361/699 |
| 2009/0065178 | A1 * | 3/2009 | Kasezawa | B21J 5/12 165/104.19 |
| 2009/0236083 | A1 * | 9/2009 | Brand | F28F 3/048 165/133 |
| 2012/0006523 | A1 * | 1/2012 | Masahiro | B21C 37/225 165/185 |
| 2012/0205086 | A1 | 8/2012 | Nakamura et al. | |
| 2012/0305292 | A1 * | 12/2012 | Hori | H01L 23/3735 174/252 |
| 2013/0112388 | A1 * | 5/2013 | Kwak | H01L 23/473 165/185 |
| 2014/0069615 | A1 * | 3/2014 | Kusaka | H01L 23/473 165/104.19 |
| 2014/0290042 | A1 | 10/2014 | Loong et al. | |
| 2014/0339693 | A1 * | 11/2014 | Hotta | H01L 27/0629 257/714 |
| 2015/0102480 | A1 * | 4/2015 | Nakagawa | H01L 23/3672 257/714 |
| 2015/0194363 | A1 * | 7/2015 | Jun | H01L 21/3065 257/714 |
| 2017/0301662 | A1 * | 10/2017 | Kimura | H01L 23/49548 |
| 2017/0330767 | A1 * | 11/2017 | Kang | C23C 14/588 |
| 2018/0238642 | A1 * | 8/2018 | Seki | H05K 7/20 |
| 2018/0245862 | A1 * | 8/2018 | Bungo | F28F 13/003 |

FOREIGN PATENT DOCUMENTS

| | | |
|---|---|---|
| CN | 206136542 | 4/2017 |
| CN | 207011178 | 2/2018 |
| CN | 108022895 | 5/2018 |
| CN | 208270917 | 12/2018 |
| JP | 2007103748 | 4/2007 |
| KR | 20030018478 | 3/2003 |
| TW | M289878 | 4/2006 |
| TW | 200706100 | 2/2007 |
| TW | M557965 | 4/2018 |

* cited by examiner

LIQUID COOLED HEAT DISSIPATION DEVICE

CROSS-REFERENCE TO RELATED APPLICATION

This application claims the priority benefit of China application serial no. 201810520554.2, filed on May 28, 2018. The entirety of the above-mentioned patent application is hereby incorporated by reference herein and made a part of this specification.

BACKGROUND OF THE INVENTION

Field of the Invention

The disclosure relates to a heat dissipation device, and in particular to a liquid cooled heat dissipation device.

Description of Related Art

Conventional projectors generally use high pressure mercury lamps as the light source for projection. In recent years, as the semiconductor manufacturing process advances, light sources made of a semiconductor device (e.g., a light-emitting diode or a laser diode) have been developed in view of the advantages including a small size, a high luminance, etc. However, the small size is accompanied with a disadvantage of a higher heating density of the semiconductor device. Therefore, the semiconductor device has a higher requirement for the heat dissipation effect.

Nowadays, heat dissipation is performed by attaching a water cooled heat dissipation module to a heat source. The waste heat generated by the heat source is first conducted to cooling fins. Meanwhile, cooling water is flowed into the heat dissipation module, so that the cooling fins can then transfer the waste heat into the cooling water. The cooling water carries the waste heat away from the water cooled heat dissipation module, and then dissipates the waste heat to the external environment through conduction and convection. However, the current water cooled heat dissipation modules generally adopt the cooling fins formed by stamping metal thin plates, and has the inferior thermal conduction effect. The cooling water enters the heat dissipation module and contacts the cooling fins. The temperature of the cooling fins decreases as the cooling fins extend away from the heat source (i.e., as the height increases). This means that the heat dissipation efficiency at the top portion of the cooling fins is undesirable.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY OF THE INVENTION

The invention provides a liquid cooled heat dissipation device that can improve thermal conduction and thermal transfer performance overall the cooling fin modules.

The liquid cooled heat dissipation device of the invention includes a housing, at least two cooling fin modules, an input pipe, and an output pipe. The housing includes a top plate, a bottom plate, a front plate, a rear plate, and two opposite side plates. The top plate, the bottom plate, the front plate, the rear plate, and the two side plates form an accommodation space. The at least two cooling fin modules are disposed in the accommodation space. The input pipe is disposed on the top plate, the front plate, the rear plate, or one of the side plates of the housing and communicates with the accommodation space. The output pipe is disposed on the top plate, the front plate, the rear plate, or the other one of the side plates of the housing and communicates with the accommodation space. The at least two cooling fin modules have different arrangement densities and the at least two cooling fin modules have different fin thicknesses. The cooling liquid flows into the housing via the input pipe, passes through the at least two cooling fin modules, and then flows out of the housing via the output pipe.

Base on the above, a liquid cooled heat dissipation device of the invention is adapted for heat dissipation of a heat source. The liquid cooled heat dissipation device has at least two cooling fin modules with different arrangement densities and different fin thicknesses. Specifically, one of the at least two cooling fin modules having a lower arrangement density but a greater fin thickness is disposed on the bottom plate of the housing, and another one of the at least two cooling fin modules having a higher arrangement density but a lesser fin thickness is disposed above the one of the at least two cooling fin modules. Since the cooling fin module has a greater fin thickness, it is favorable to absorbing the waste heat transferred from the heat source to the bottom plate. On the other hand, due to the another one of the cooling fin modules with a higher arrangement density has a greater thermal transfer area, when the cooling liquid enters the housing via at least one input pipe and passes through the at least two cooling fin modules, the configuration of the invention contributes to rapidly transfer the waste heat of the cooling fin modules to the cooling liquid and have the cooling liquid carry the waste heat away from the housing. Therefore, the liquid cooled heat dissipation device of the invention combines the at least two cooling fin modules having different properties, and thermal transfer performance and heat dissipation effect overall the liquid cooled heat dissipation device can thus be improved.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1A:
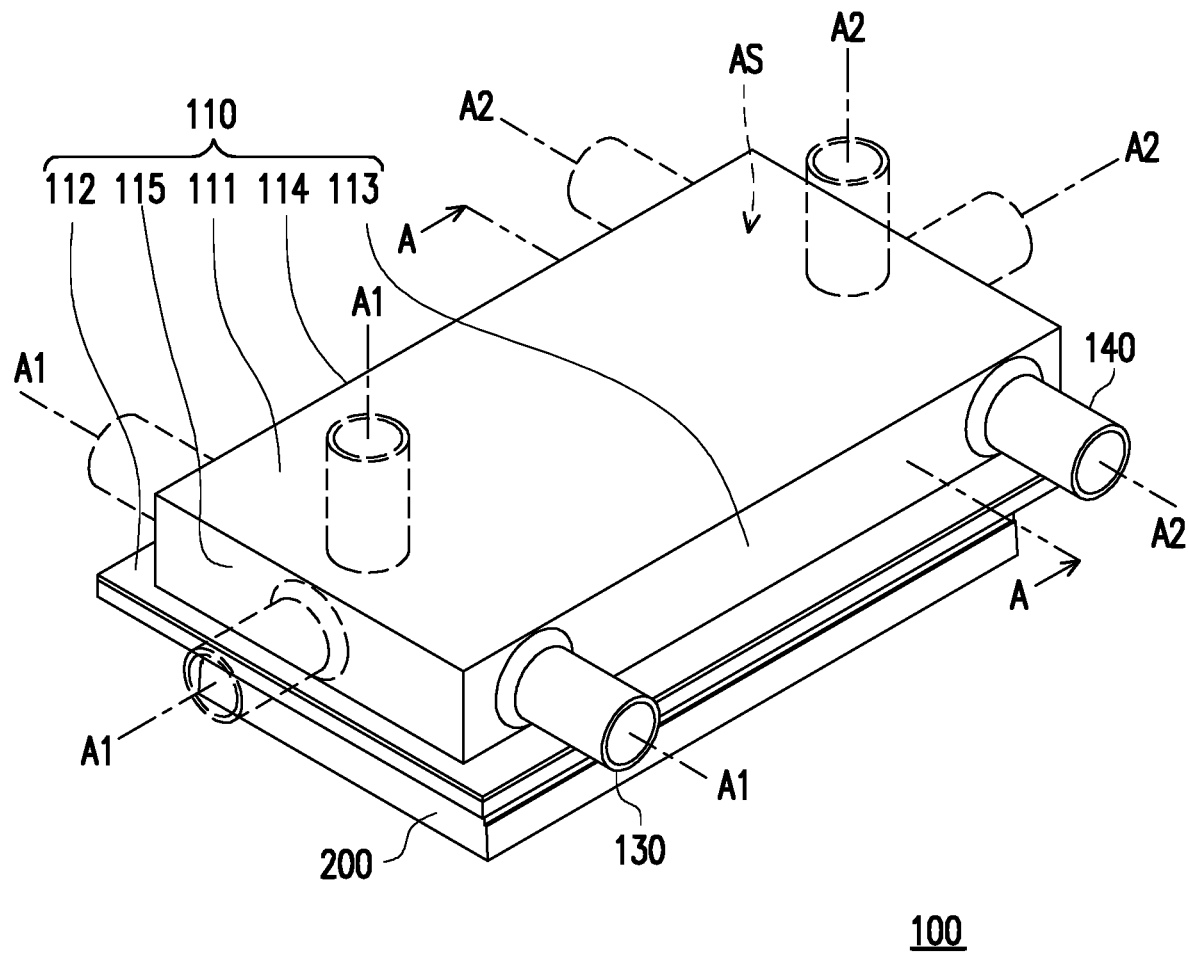
FIG. 1A is an outside view illustrating a liquid cooled heat dissipation device according to an embodiment of the invention.
Figure 1B:
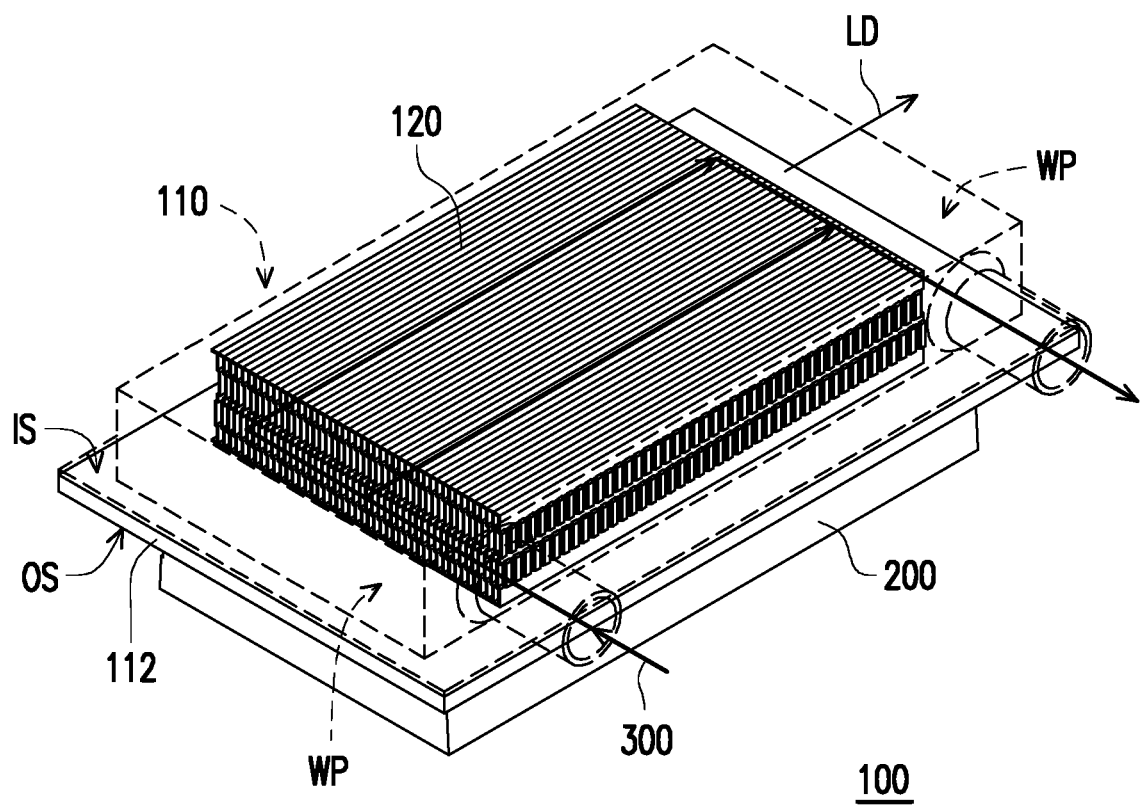
FIG. 1B is a perspective schematic diagram illustrating the liquid cooled heat dissipation device of FIG. 1A.
Figure 1C:
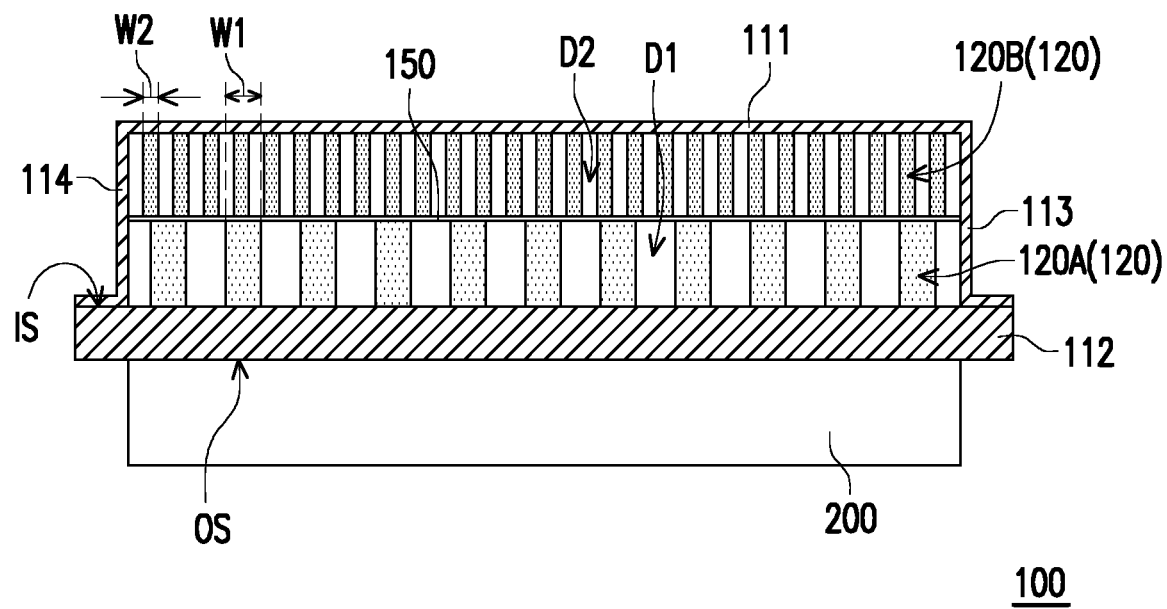
FIG. 1C is a cross-section A-A schematic diagram illustrating the liquid cooled heat dissipation device of FIG. 1A.

FIG. 1A is an outside view illustrating a liquid cooled heat dissipation device according to an embodiment of the invention. FIG. 1B is a perspective schematic diagram illustrating the liquid cooled heat dissipation device of FIG. 1A. FIG. 1C is a cross-section A-A schematic diagram illustrating the liquid cooled heat dissipation device of FIG. 1A.

Referring to FIG. 1A, a liquid cooled heat dissipation device 100 of the embodiment is configured to be disposed on a heat source 200 to heat dissipation for the heat source 200 and prevent overheating of the heat source 200. Specifically, the heat source 200 is, for example, a light source of a projector (e.g., a light-emitting diode, a laser diode, or light-emitting diodes or laser diodes arranged in an array) or a light modulator (e.g., a reflective or transmissive spatial light modulator). The reflective spatial light modulator is, for example, a reflective liquid crystal on silicon (LCOS) or a digital micro-mirror device (DMD). The transmissive spatial light modulator is, for example, a transparent liquid crystal panel. The heat source 200 may also be a central processing unit (CPU), a graphics processing unit (GPU), or another electronic device that generates high heat in a computer. The liquid cooled heat dissipation device 100 is in contact with the surface of the heat source 200, and the waste heat generated by the heat source 200 is conducted to the liquid cooled heat dissipation device 100 through thermal conduction. When the heat source 200 is operating, cooling effect can be achieved, and the operation of the heat source 200 is not affected by an overly high temperature.

Referring to FIG. 1A to FIG. 1C, the liquid cooled heat dissipation device 100 of the embodiment includes a housing 110, at least two cooling fin modules 120, an input pipe 130, and an output pipe 140.

The housing 110 includes a top plate 111, a bottom plate 112, a front plate 113, a rear plate 114, and two opposite side plates 115. Moreover, the top plate 111, the bottom plate 112, the front plate 113, the rear plate 114, and the two side plates 115 are in contact with each other to form an enclosed accommodation space AS. In addition, the bottom plate 112 has an inner surface IS and an outer surface OS opposite to each other. The outer surface OS is configured to directly contact the heat source 200 for heat dissipation through thermal conduction.

In the embodiment, the number of the at least two cooling fin modules 120 is two, for example, including a first cooling fin module 120A and a second cooling fin module 120B. The first cooling fin module 120A and the second cooling fin module 120B respectively have different arrangement densities and different fin thicknesses, wherein the arrangement density refers to the number of fins included in a unit area. The first cooling fin module 120A and the second cooling fin module 120B respectively include a plurality of fins. The first cooling fin module 120A and the second cooling fin module 120B are both disposed in the accommodation space AS of the housing 110 and are in contact with each other. The first cooling fin module 120A is disposed on the bottom plate 112 and is in contact with the inner surface IS. The second cooling fin module 120B is disposed on the first cooling fin module 120A and is in contact with the inner-side surface of the top plate 111 of the housing 110. Specifically, the first cooling fin module 120A is disposed between the bottom plate 112 and the second cooling fin module 120B. In other embodiments, the at least two cooling fin modules may be plural and may be stacked on each other between the top plate and the bottom plate of the housing, which depends on the size of the liquid cooled heat dissipation device or the heat dissipation requirements.

In the embodiment, the arrangement density of the first cooling fin module 120A in contact with the inner surface IS of the bottom plate 112 is lower than the arrangement density of the second cooling fin module 120B in contact with the inner-side surface of the top plate 111. Moreover, any one fin thickness W1 of the fins of the first cooling fin module 120A is greater than any one fin thickness W2 of the fins of the second cooling fin module 120B. Here, since the fin thickness W1 of the first cooling fin module 120A is greater, it is favorable to absorbing the waste heat transferred from the heat source 200 to the bottom plate 112 through thermal conduction, such that the first cooling fin module 120A has a higher heat dissipation efficiency for the bottom plate 112. Moreover, the arrangement density of the first cooling fin module 120A is lower and thus allows a cooling liquid 300 to pass easily. Namely, a large amount of the cooling liquid 300 may pass through the space between the fins of the first cooling fin module 120A. Since the fin thickness W2 of the second cooling fin module 120B is lower and the arrangement density is higher, the fins of the second cooling fin module 120B have a larger thermal transfer area, which is favorable to rapidly transferring the waste heat thermally conducted to the second cooling fin module 120B through thermal transfer to the cooling liquid 300 and carrying away the waste heat through the cooling liquid 300.

The input pipe 130 is selectively disposed on the top plate 111, the front plate 113, the rear plate 114, or one of the side plates 115 of the housing 110 and communicates with the accommodation space AS. The output pipe 140 is selectively disposed on the top plate 111, the front plate 113, the rear plate 114, or the other one of the side plates 115 of the housing 110 and communicates with the accommodation space AS (FIG. 1A and FIG. 1B show an example where the input pipe 130 and the output pipe 140 are both disposed on the front plate 113). Specifically, the external cooling liquid 300 flows into the housing 110 via the input pipe 130, and the cooling liquid 300 passes through the first cooling fin module 120A and the second cooling fin module 120B to absorb the waste heat. Then, the cooling liquid 300 flows out of the housing 110 via the output pipe 140, thereby completing single heat dissipation circulation process.

In addition, an axial direction A1 of the input pipe 130 and an axial direction A2 of the output pipe 140 are, for example, perpendicular or parallel to a normal line direction of the plane of the bottom plate 112 of the housing 110 and the heat source 200. Alternatively, the axial direction A1 of the input pipe 130 and the axial direction A2 of the output pipe 140 may be respectively perpendicular or parallel to the normal line direction of the plane of the bottom plate 112 and the heat source 200. The multiple embodiments described above may be determined according to the specification or requirement of the liquid cooled heat dissipation device and are not limited herein. Moreover, when the axial direction A1 of the input pipe 130 is perpendicular to the bottom plate 112 of the housing 110, the cooling liquid 300 is passed through the input pipe 130, and the cooling liquid 300 enters the accommodation space AS and directly contacts the bottom plate 112, thereby generating the impingement cooling effect.

In the embodiment, the first cooling fin module 120A and the second cooling fin module 120B are disposed at the center of the accommodation space AS and are spaced apart from the two side plates 115 of the housing 110 to form two flow paths WP. Specifically, the first cooling fin module 120A and the second cooling fin module 120B are disposed between the two flow paths WP. Moreover, the first cooling fin module 120A and the second cooling fin module 120B are spaced apart from the two side plates 115 with an identical gap, and the input pipe 130 and the output pipe 140 respectively communicate with the corresponding two flow paths WP.

More specifically, the first cooling fin module 120A and the second cooling fin module 120B have an identical extension direction LD, and the extension direction LD is parallel to the front plate 113 and the rear plate 114. In other words, the extension direction LD of the first cooling fin module 120A and the second cooling fin module 120B is perpendicular to a normal line direction of the front plate 113 and the rear plate 114. The first cooling fin module 120A and the second cooling fin module 120B respectively have a plurality of fin grooves D1, D2, and the openings of the plurality of fin grooves D1, D2 are respectively oriented toward the two side plates 115. Any one fin groove D1 of the fins of the first cooling fin module 120A is greater than any one fin groove D2 of the fins of the second cooling fin module 120B. The cooling liquid 300 flowing in via the input pipe 130 flows from one of the flow paths WP to the other one of the flow paths WP along the extension direction LD of the two cooling fin modules 120A, 120B.

In the flowing process, the cooling liquid 300 respectively flows into the plurality of fin grooves D1, D2 to pass through and contact the first cooling fin module 120A and the second cooling fin module 120B. Specifically, the amount of flow of the cooling liquid 300 passing through the plurality of fin grooves D1 is greater than the amount of flow through the plurality of fin grooves D2. In the embodiment, a ratio of the fin groove D1 width to the fin groove D2 width is 1.2 to 2.5 but is not limited hereto. The ratio of the fin groove D1 width to the fin groove D2 width may be changed according to the amount of flow of the cooling liquid 300.

As a result, the effects of flow resistance optimization and flow distribution of the cooling liquid 300 can be achieved, and the cooling liquid 300 can be effectively used to improve thermal conduction and thermal transfer performance overall the liquid cooled heat dissipation device.

Referring to FIG. 1C, in the embodiment, the liquid cooled heat dissipation device 100 further includes a partition plate 150 disposed between the first cooling fin module 120A and the second cooling fin module 120B and leaning in the front plate 113 and the rear plate 114 of the housing 110. The partition plate 150 is configured to separate the first cooling fin module 120A and the second cooling fin module 120B such that the cooling liquid 300 is divided in the flowing process and respectively flows into the plurality of fin grooves D1, D2. In the embodiment, the partition plate 150, the first cooling fin module 120A, and the second cooling fin module 120B are an integrally formed forged structure. In other embodiments, the two cooling fin modules and the partition plate are connected to form an integral structure through welding, or the two cooling fin modules merely lean in and contact the partition plate and do not form an integral structure with the partition plate. In other embodiments, the two cooling fin modules do not require the partition plate, and the two cooling fin modules are in direct contact with each other.

In summary of the above, the liquid cooled heat dissipation device of the invention is adapted for heat dissipation of the heat source and includes the two cooling fin modules having different arrangement densities and different fin thicknesses. Specifically, the cooling fin module having a lower arrangement density but a greater fin thickness is disposed on the bottom plate of the housing, and the cooling fin module having a higher arrangement density but a lesser fin thickness is disposed thereabove. Since one of the cooling fin modules has a greater fin thickness, it is favorable to absorbing the waste heat transferred from the heat source to the bottom plate. On the other hand, when the cooling liquid enters the housing via the input pipe and passes through the two cooling fin modules, since the other one of the cooling fin modules with a higher arrangement density has a greater thermal transfer area, it can rapidly transfer the waste heat of the cooling fin modules to the cooling liquid and have the cooling liquid carry the waste heat away from the housing. Therefore, the liquid cooled heat dissipation device of the invention combines the two cooling fin modules having different properties, and the overall thermal conduction performance, thermal transfer performance, and heat dissipation effect of the liquid cooled heat dissipation device can thus be improved. Moreover, the amounts of flow of the cooling liquid passing through the plurality of fin grooves of the two cooling fin modules are different. Thereby, the effects of flow resistance optimization and flow distribution of the cooling liquid can be achieved, and the cooling liquid can be effectively used to improve the thermal transfer performance overall the liquid cooled heat dissipation device.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive.

Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the disclosure is intended to be dedicated to the public regardless of whether the element or component is explicitly recited in the following claims.

What is claimed is:

1. A liquid cooled heat dissipation device comprising:
   a housing, comprising: a top plate, a bottom plate, a front plate, a rear plate, and two opposite side plates, wherein the top plate, the bottom plate, the front plate, the rear plate, and the two side plates form an accommodation space;
   at least two cooling fin modules disposed in the accommodation space;
   an input pipe, disposed on the top plate, the front plate, the rear plate, or one of the side plates of the housing, communicating with the accommodation space; and
   an output pipe, disposed on the top plate, the front plate, the rear plate, or the other one of the side plates of the housing, communicating with the accommodation space,
   wherein the at least two cooling fin modules have different arrangement densities and the at least two cooling fin modules have different fin thicknesses, and a cooling liquid flows into the housing via the input pipe, passes through the at least two cooling fin modules, and then flows out of the housing via the output pipe,
   the at least two cooling fin modules are disposed between the two flow paths,
   the bottom plate is configured to contact a heat source and the input pipe and the output pipe are not disposed on the bottom plate,
   the bottom plate comprises an inner surface and an outer surface opposite to each other, wherein one of the at least two cooling fin modules is in contact with the inner surface, another one of the at least two cooling fin modules is in contact with the top plate, and the outer surface is configured to contact the heat source, and
   the one of the at least two cooling fin modules in contact with the inner surface has an arrangement density lower than an arrangement density of the another one of the at least two cooling fin modules.

2. The liquid cooled heat dissipation device according to claim 1, wherein an extension direction of the at least two cooling fin modules is parallel to the front plate and the rear plate, and the cooling liquid flows from one of the flow paths to the other one of the flow paths along the extension direction.

3. The liquid cooled heat dissipation device according to claim 1, wherein any one fin thickness of the fins of the one of the at least two cooling fin modules is greater than any one fin thickness of the fins of the another one of the at least two cooling fin modules.

4. The liquid cooled heat dissipation device according to claim 1, wherein the at least two cooling fin modules respectively comprise a plurality of fin grooves, and the plurality of fin grooves are respectively oriented toward the two side plates, wherein the cooling liquid flows into the plurality of fin grooves to pass through the at least two cooling fin modules.

5. The liquid cooled heat dissipation device according to claim 4, wherein any one fin groove width of the fins of one of the at least two cooling fin modules is greater than any one fin groove width of the fins of another one of the at least two cooling fin modules.

6. The liquid cooled heat dissipation device according to claim 1, wherein the at least two cooling fin modules are plural and are stacked on each other between the top plate and the bottom plate.

7. The liquid cooled heat dissipation device according to claim 1, further comprising at least one partition plate disposed between the at least two cooling fin modules and leaning in the front plate and the rear plate.

8. The liquid cooled heat dissipation device according to claim 7, wherein the at least one partition plate and the at least two cooling fin modules are integrally formed.

9. The liquid cooled heat dissipation device according to claim 1, wherein the at least two cooling fin modules are spaced apart from the two side plates to form two flow paths, and the input pipe and the output pipe respectively communicate with the two flow paths.

* * * * *